(12) United States Patent
Merettig

(10) Patent No.: US 8,559,020 B2
(45) Date of Patent: Oct. 15, 2013

(54) OPTOELECTRONIC COMPONENT AND LIGHT SENSOR HAVING SAME

(75) Inventor: Gerhard Merettig, Sexau (DE)

(73) Assignee: Sick AG, Waldkirch (DE)

( * ) Notice: Subject to any disclaimer, the term of this patent is extended or adjusted under 35 U.S.C. 154(b) by 39 days.

(21) Appl. No.: 13/416,530

(22) Filed: Mar. 9, 2012

(65) Prior Publication Data

US 2012/0236322 A1 Sep. 20, 2012

(30) Foreign Application Priority Data

Mar. 14, 2011 (EP) ..................................... 11158160

(51) Int. Cl.
*G01B 11/14* (2006.01)

(52) U.S. Cl.
USPC .......................................... 356/623; 356/622

(58) Field of Classification Search
USPC ................ 356/614–624, 3.03–3.07; 250/221, 250/559.29, 559.38, 559.4, 200, 216, 250/559.01

See application file for complete search history.

(56) References Cited

FOREIGN PATENT DOCUMENTS

DE       100 61 649 A1     8/2001

OTHER PUBLICATIONS

Fortunato, E., et al., "New Ultra-Light Flexible Large Area Thin Film Position Sensitive Detector Based on Amorphous Silicon," Journal of Non-Crystalline Solids, 2000, pp. 1213-1217, Elsevier Science B.V.
Fortunato et al., "New ultra-light flexible large area thin film position sensitive detector based on amorphous silicon", Journal of Non-Crystalline Solids, 266-269, (2000), pp. 1213-1217.

*Primary Examiner* — Tri T Ton
(74) *Attorney, Agent, or Firm* — Nath, Goldberg & Meyer; Jerald L. Meyer; Sanjana Mangalagiri

(57) ABSTRACT

The invention relates to an optoelectronic component for the positional determination of an incident light beam in a longitudinal axis direction, having flat sides, longitudinal sides and two oppositely disposed end sides, having a low ohmic first contact layer at a first flat side for a first electric contact (cathode) and having at least two low ohmic second contact layers along the end sides for second contacts (anodes). The invention additionally relates to a light sensor having such a component. To provide an improved optoelectronic component for the positional determination of an incident light beam as well as to provide an improved light sensor having such an optoelectronic component, it is proposed that at least one of the second contact layers not only extends along the end side but also over part sections along a second and third long side longitudinal side.

9 Claims, 5 Drawing Sheets

Figure 1:
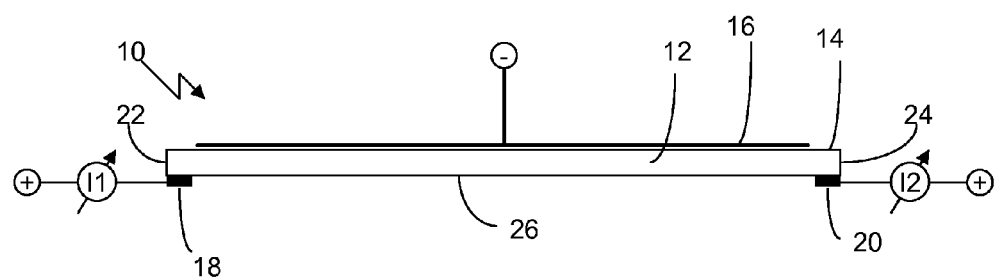

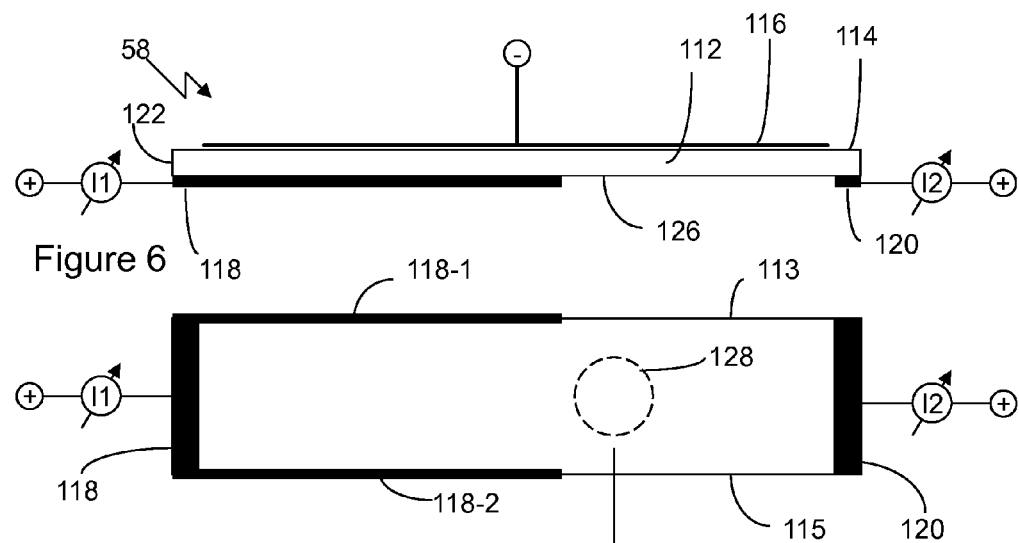
Figure 6
Figure 7
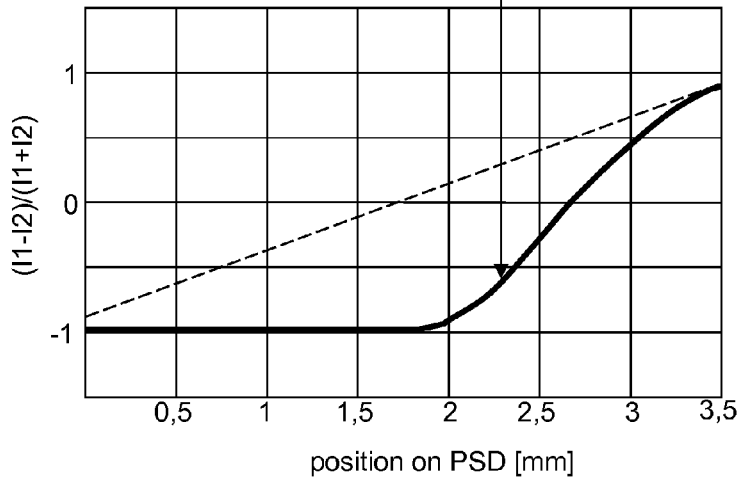
Figure 8

OPTOELECTRONIC COMPONENT AND LIGHT SENSOR HAVING SAME

The invention relates to an optoelectronic component for the positional determination of an incident light beam in a longitudinal direction and to a light sensor which works in accordance with the triangulation principle and having such a component.

Light sensors which work in accordance with the triangulation principle have a light transmitter for generating a transmission light beam and an optical light reception system having a light receiver which detects the light beam reflected at an object. The light receiver is designed as spatially resolving in this respect, with the point of incidence of the light beam on the receiver being dependent on the distance of the object from the light sensor. The light sensor must in this respect only be designed as spatially resolving in one direction.

Three different types of light receiver have previously been used for such light sensors.

In a first alternative, a so-called dual element as a receiver which is essentially made up of two photodiodes positioned next to one another. Such a dual element, however, has various disadvantages. It can thus only be determined by a dual element whether the object is located at this side or that side of a specific distance, that is whether the reflection of the light beam is detected either on the first element or on the second element. This is, however, sufficient for a plurality of applications; however, the detection spacing can only be set mechanically in that, for example, an additional mirror directs the light reflection onto the receiver and the mirror is then pivotably adjustable. Alternatively, the optical reception system could also be made displaceable. Both mean a high mechanical effort and an additional construction space which is not available in subminiature devices. The embodiment with a displaceable optical reception system is furthermore disadvantageous since a reception lens can then not be integrated in a front screen. Furthermore, mechanical adjustments of the transmission lens, the optical reception system or the mirror are very difficult to implement in very small devices and produce a deterioration in detection. In addition, particularly with small devices, mechanical instabilities have a particularly high effect on the setting of the object distance.

In a second alternative, the light receiver is made as a photodiode array, for example as a linear diode array. Linear photodiode arrays having a corresponding evaluation unit for each of the plurality of photodiodes require a corresponding construction space which is not available with very small sensors. To save construction space, additional elements such as a special evaluation device for interference suppression or the like has to be dispensed with to be able to accommodate the light receiver with the corresponding evaluation device in the available space.

Furthermore, so-called PSD elements (position sensitive devices) are known which, however, have the disadvantage that they only deliver a poor separation of background from foreground, that is the exact limit distance from which the background which should not be detected starts cannot be determined with sufficient distinction. PSD elements furthermore have the disadvantage of high black-and-white shift. Black-and-white shift means the shift of the detection distance which occurs when a bright white object is detected, on the one hand, and a dark black object is detected on the other hand. The detected distance with the PSD is therefore dependent to a certain extent on the intensity of the incident light.

Such a PSD element is known from EP 0 206 840 A2 which shows a triangulation sensor which has a photodiode structure and contacts to the photodiode structure. The photodiode structure is covered on the light reception side by a light-permeable and electrically insulating protective layer which only leaves a respective strip free at the two end margins. The contact to an electrode takes place via these strips, with a part of the electrode additionally extending over the light-permeable protective layer. A part of the photodiode structure is thereby shaded to screen the photodiode structure from unwanted light incidence and to reduce the "shot noise". The protective layer is electrically insulating so that the known properties of the PSD element for positional determination by the photocurrents flowing off to the electrodes are not influenced.

Starting from this prior art, it is the object of the invention to provide an improved optoelectronic component for the positional determination of an incident light beam as well as to provide a light sensor having such an optoelectronic component which no longer has the aforesaid disadvantages and can in particular be made extremely small at reduced costs.

This object is satisfied by an optoelectronic component having the features of claim 1 and a light sensor having the features of claim 8.

The optoelectronic component in accordance with the invention for the positional determination of an incident light beam in a longitudinal direction has a photodiode structure having flat sides, longitudinal sides and two oppositely disposed end sides. One of the flat sides has a first low ohmic contact layer for a first electric contact, for example a cathode, and two low ohmic contact layers which form the anodes are provided along the end sides. In accordance with the invention, at least one of the second contact layers not only extends along the end side, but also over part sections along a second and third longitudinal side which are oppositely disposed, with the part sections also having contact to the photodiode structure.

The linearity over the total length of the PSD element is admittedly thereby canceled but, on the other hand, the PSD properties are reduced to a part region of the PSD element, namely to the region disposed between the other second contact layer and the ends of the part sections. The light reception element is thus so-to-say divided operation-wise so that a part of the element functions as a standard photodiode, namely the part over which the part sections extend, and the remainder behaves as a "normal" PSD element. It is thereby achieved that the PSD transition is only present in the region between the low ohmic connections. As a consequence of this, a steeper transition is then formed in this region than if it were to extend over the total light reception element. A more accurate setting possibility of a limit distance is thereby present when the optoelectronic component in accordance with the invention is used in a light sensor with which primarily objects should only be detected within a limit distance and objects in the background should not be detected. In this respect, it is a so-called light sensor having background suppression, also briefly called a BGS sensor.

The steeper transition region of the component in accordance with the invention produces an exact setting possibility of the limit distance and also allows a smaller hysteresis or smaller black-and-white shifts, with the advantages of a PSD element, namely the possibility of providing very small construction space and being inexpensive, being maintained.

It is of advantage for an exact setting of the limit distance if the second contact layers are formed symmetrical to the longitudinal axis and if the part sections extend equally far at oppositely disposed longitudinal sides.

The PSD transition region in the optoelectronic component in accordance with the invention is defined particularly well when the part sections are connected to one another at their end remote at the end side. The same potential is then namely present over the total width (transverse to the longitudinal direction), that is the equipotential lines extend substantially parallel to the end side.

In a further development of the invention, the connection of the part sections can pass through, that is interrupt, the light-sensitive layer from one longitudinal side to the other.

In a further development of the invention, further low ohmic dividing layers which extend parallel to the end sides and which extend from one longitudinal side to the other are provided between the low ohmic contact layers extending parallel to the end sides. These dividing layers have no contact to the anode or cathode. In particular when these dividing layers not only extend from one longitudinal side to the other, but also extend along dividing layer part sections along the longitudinal sides, the optoelectronic component in accordance with the invention so-to-say has a plurality of PSD transitions so that overall something similar to stepped transitions can be produced. A plurality of regions can thereby be defined in which an improved setting of scanning distances is possible.

The optoelectronic component in accordance with the invention is preferably used in a light sensor which works according to the triangulation principle. The distance of an object from the light sensors can be determined by means of an evaluation unit from the point of incidence of the light beam reflected by the object on the light reception element, that is the optoelectronic component, as is known from triangulation sensors known per se. The special area of application of this light sensor in accordance with the invention is in the application as a BGS sensor, that is in the defining of a limit spacing beyond which the background is defined and all signals of objects in the background are ignored and an output signal is only applied to a corresponding output when an object is located within the limit spacing.

Figure 2:
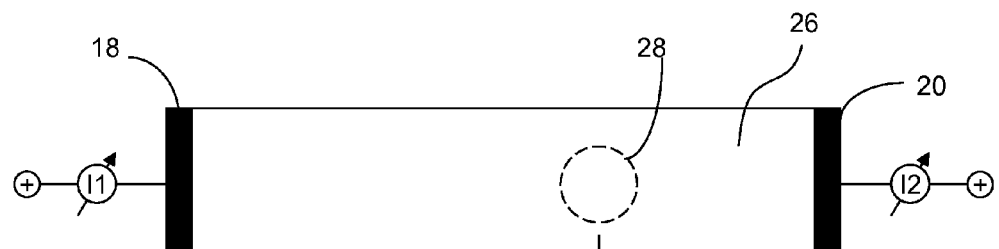
Figure 3:
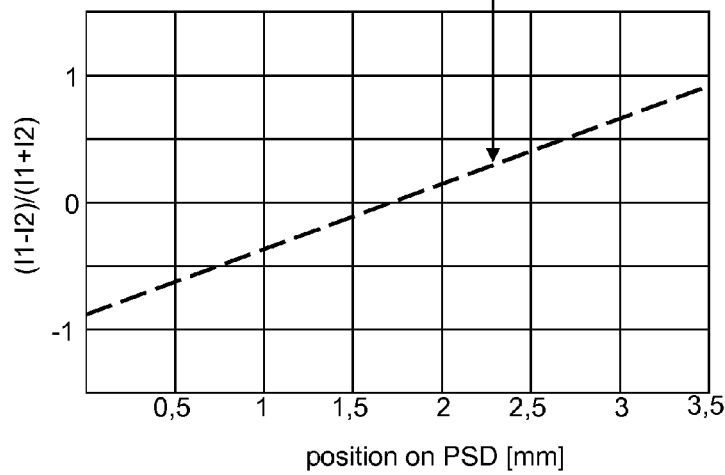
Figure 4:
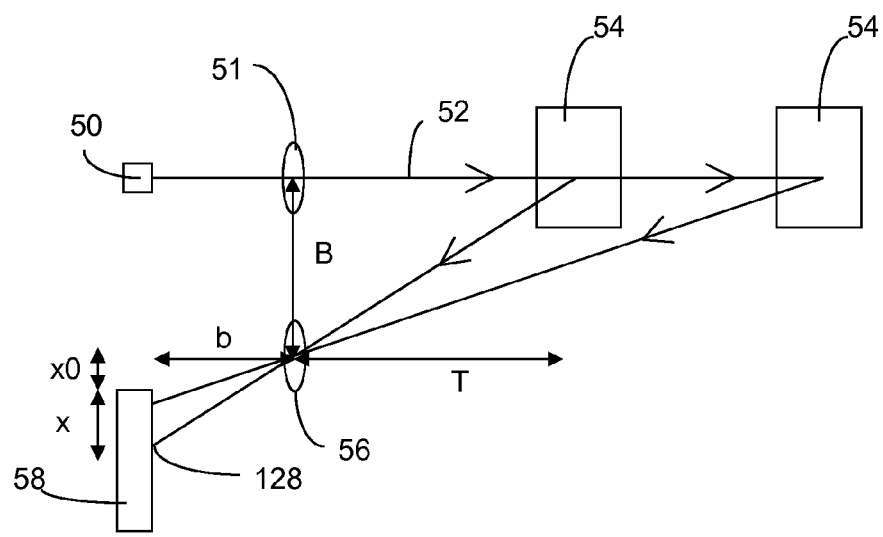
Figure 5:
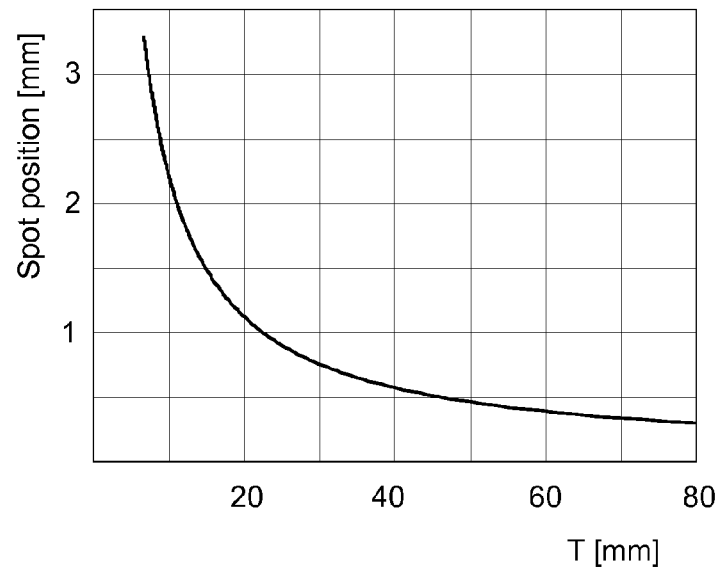
Figure 9:
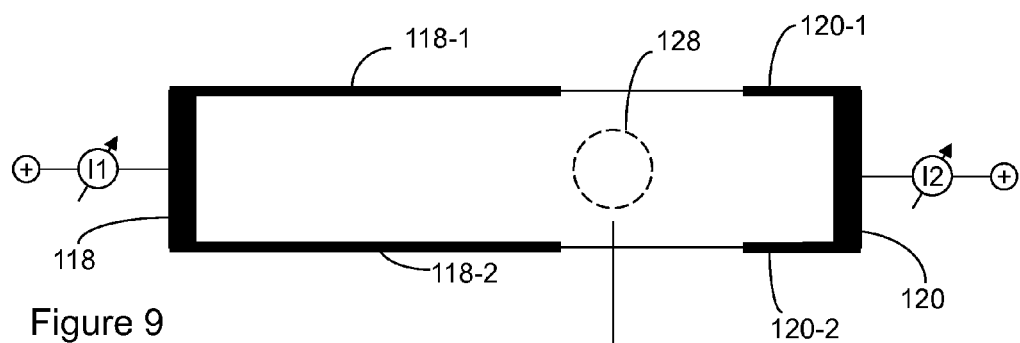
Figure 10:
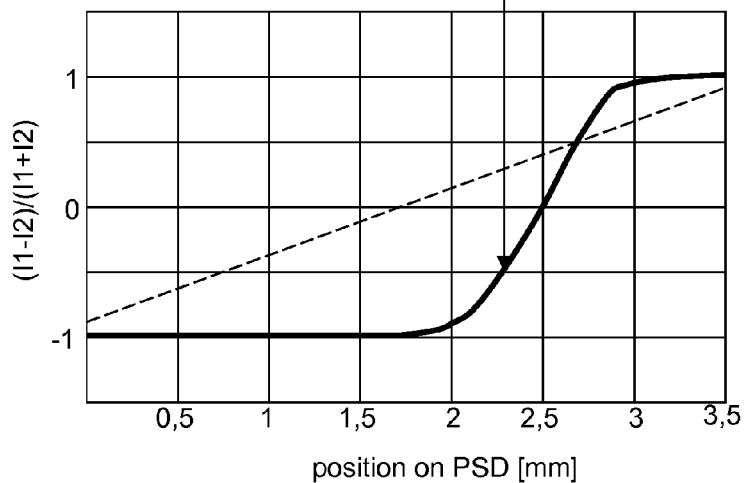
Figure 11:
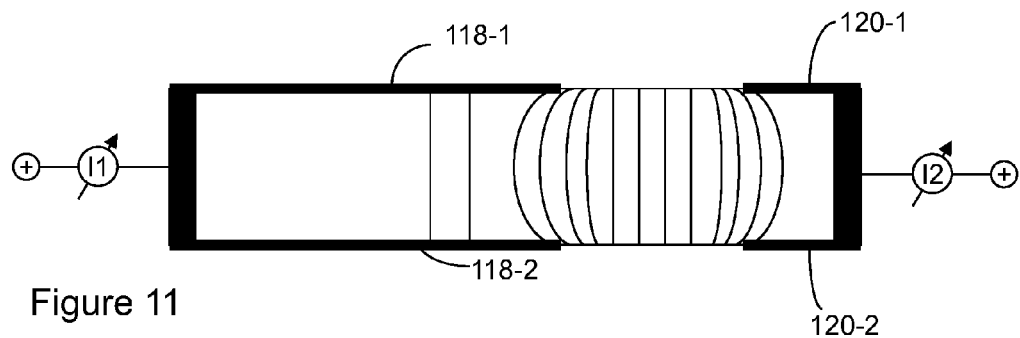
Figure 12:
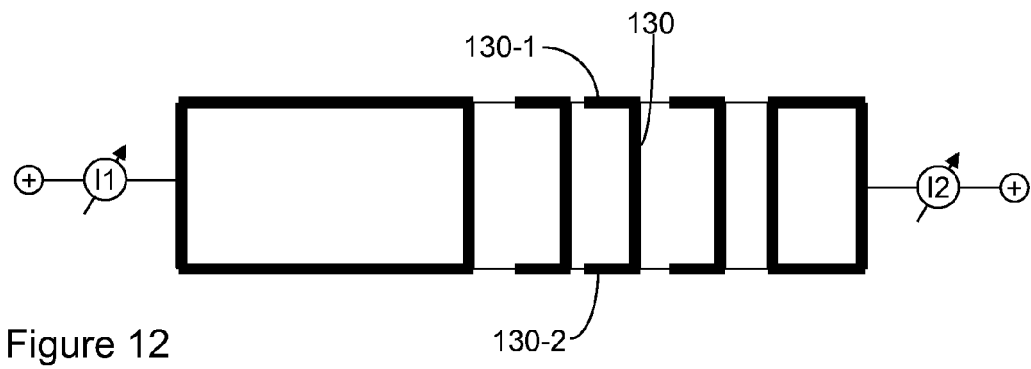
Figure 13:
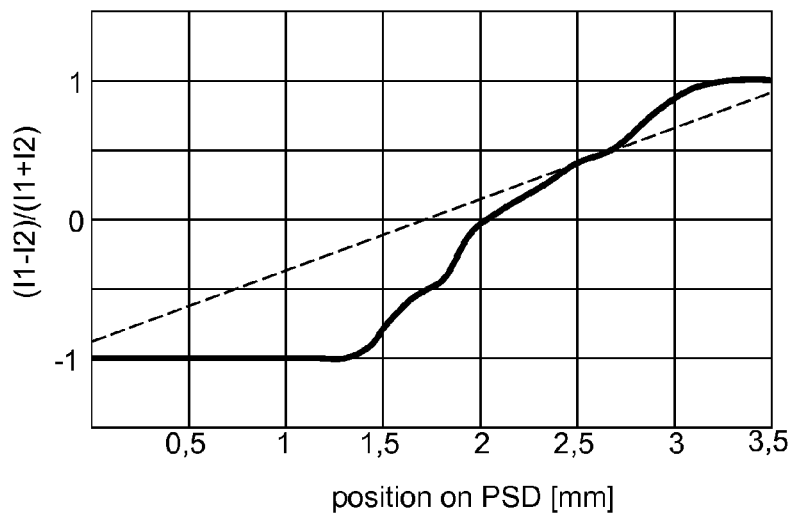

The invention will be explained in detail in the following with reference to embodiments and to the drawing. There are shown in the drawing:

FIG. 1 a PSD element in accordance with the prior art in a side view;

FIG. 2 the PSD element of FIG. 1 in a plan view of the light-sensitive layer;

FIG. 3 a characteristic of the PSD element of FIGS. 1 and 2 in which the current distribution over the two anodes is entered with respect to the point of incidence of a light spot on the PSD element;

FIG. 4 a schematic representation of a light sensor in accordance with the invention;

FIG. 5 a characteristic of the light sensor in accordance with FIG. 4 in which the position of incidence of a light reception beam on the light reception element is entered with respect to the scanning angle;

FIG. 6 a schematic representation of a side view of a component in accordance with the invention;

FIG. 7 a plan view of the light reception side of the component in accordance with FIG. 6;

FIG. 8 a characteristic as in FIG. 3 of the component in accordance with the invention of FIGS. 6 and 7;

FIG. 9 a view as FIG. 7 of a further embodiment of the component in accordance with the invention;

FIG. 10 a representation of the characteristic of the embodiment of FIG. 9;

FIG. 11 representations of the PSD transition with the aid of equipotential lines of a component in accordance with the invention of the embodiment in accordance with FIG. 9;

FIG. 12 a further embodiment of the component in accordance with the invention; and FIG. 13 a corresponding characteristic in a schematic representation.

FIGS. 1 to 3 show a usual one-dimensional PSD element 10 as is known from the prior art. The explanations with respect to FIGS. 1 to 3 primarily serve for the definition of terminology to be able better to understand the invention and in particular the differences from the previous prior art.

The PSD element 10 is an optoelectronic component which has an areal PN structure or PIN structure such as in a photodiode which is marked by the reference numeral 12 in FIG. 1. One of the doped layers, as a rule the N doped layer, is areally connected at a first flat side 14 to a low ohmic first contact layer 16 and the other doped layer is connected to at least two low ohmic second contact layers 18 and 20 which extend along the end sides 22 and 24. If a light reception side 26 is exposed to light by a light spot 28, a photocurrent arises in the region of the exposure to light which flows off as current $I1$ and $I2$ via the low ohmic contacts 18 and 20 disposed at the end sides at a specific ratio depending on the light position viewed in the longitudinal direction of the PSD element 10. The portions $I1$ and $I2$ of the current are determined by the resistance present between the light spot and the respective contact 18 or 20.

A usual evaluation formula for the two currents $I1$ and $I2$ is given by $$x=(I1-I2)/(I1+I2).$$

At $x=1$, the light spot is incident on the end of the PSD element 10 disposed fully at the left side in FIG. 2; at $x=0$, at the center of the component; and $x=+1$ at the far right.

The characteristic in FIG. 3 shows the corresponding linear extent over the total PSD element 10. Specific dimensional figures which are typically present are given for the purpose of a better illustration. The length of the light reception side 26 of the PSD element amounts to 3.5 mm and the diameter of the light spot 28 to 0.5 mm. For better illustration, these dimensions are also used in the following explanation of the embodiments of the optoelectronic component in accordance with the invention.

FIG. 4 shows a schematic representation of a light sensor in accordance with the invention. The light sensor has a light transmitter 50 with an optical transmission system 51 with which a light beam 52 is generated. This light beam 52 is incident on an object 54 which is located at a distance T (scanning range). The light beam 52 reflected at the object 54 is received by an optical reception system 56 and is directed to an optoelectronic component 58 in accordance with the invention which will be explained in the following. In such a triangulation arrangement, the position (spot position 128) of the received light depends on the scanning range T in accordance with the characteristic from FIG. 5. With the distance defined as the base distance B between the optical transmission system 51 and the optical reception system 56 and the distance b of the light receiver 58 from the optical reception system 56 and the distance x0 as the vertical distance of the upper edge of the light reception element 58 from the center of the optical reception system 56, there results with the intercept theories $B/T=(x+x0)/b$ or transformed: $x=(B*b)/T-x0$. It can be recognized from the characteristic of FIG. 5 that if an adjustment range between 20 and 80 mm is required less than 1 mm of the light reception element 58 is then required for the position of the light spot 28 to cover the complete detection range from 20 to 80 mm. In this respect, adjustment range means the range in which a separation of foreground and background can be set. In the foreground, an object should be recognized, that is a signal should be output that an object is present, and in the background, the objects should not result in a signal.

In order to be better able to determine the position of the light spot 28 exactly in this critical region, the optoelectronic component 58 is formed as follows in accordance with the invention:

In a first embodiment, which is shown in FIGS. 6, 7 and 8, the optoelectronic component 58 in accordance with the invention has the same photodiode structure 112 as the PSD element 10 in accordance with the prior art. A first low ohmic contact layer 116 is equally provided at a first flat side 114. Furthermore, second contact layers 118 and 120 over which the respective currents 11 and 12 flow off are provided along the end sides. In accordance with the invention, however, the one of the second contact layers 118 is now formed so that it not only extends along the end side 122, but also over part sections 118-1 and 118-2 along a second and third longitudinal side 113 and 115.

This has the effect that the PSD transition such as is shown for a PSD element in accordance with the prior art is now essentially reduced to the region between the two low ohmic contact layers 118 and 120 so that this PSD transition now lies in the ranges between 2 mm and 3.5 mm. If the light spot 128 is therefore incident on the transition region as shown in FIG. 7, a current distribution corresponding to the position is detected, as is shown in the characteristic in FIG. 8. If the light spot 128 is incident in the range between 0 and 2 mm, all the current will flow off over the contact layer 118 and 12 will be equal to 0.

FIGS. 9, 10 and 11 show a further embodiment in which the other contact layer 120 is also made in a similar manner to the first contact layer 118, that is it also has part sections along the longitudinal sides so that the PSD transition is now restricted to a range between 2 and 3 mm. A corresponding characteristic for the current distribution in dependence on the position of the point of incidence of the light spot 128 is shown in FIG. 10.

FIG. 11 shows equipotential lines which are intended to show schematically and qualitatively the region in which the PSD transition, that is so-to-say the potential drop, occurs and how the geometrical shape of the contact layers 118 and 120 influences the current flow 11 and 12.

These equipotential lines are in particular somewhat curved at the ends of the part sections 118-1 and 118-2 as well as 120-1 and 120-2 remote from the end sides; however, this has no effect for the operation as, first, they are symmetrical to the longitudinal axis and, second, the light spot 128 is so large as a rule that the curvatures do not have any larger effects. A certain "smearing" of the characteristics of FIGS. 8 and 10, actually only shown schematically, is anyway present due to the size of the light spot 128.

FIGS. 12 and 13 finally show a further embodiment in which now the ends of the part sections 118-1 and 118-2 as well as 120-1 and 120-2 remote at the end sides are connected to one another, that is the low ohmic contact layer extends from the one longitudinal side to the other longitudinal side. This means, in accordance with the equipotential image of FIG. 11, that the equipotential lines cannot "bulge" as shown in FIG. 11, that is the PSD transition becomes sharper at this point. Furthermore, this embodiment shows the possibility of providing dividing layers 130 which are low ohmic dividing layers which extend parallel to the end sides. These dividing layers are not connected to a potential and like the contact layers 118 and 120 have part sections 130-1 and 130-2 which extend along the longitudinal sides over a specific length. In this manner, the PSD transition in this embodiment can be designed stepped in a certain sense between 1.5 mm and 3 mm so that a greater steepness of the characteristic (FIG. 13) can be achieved at certain points than at other points. This could be sensible if a light sensor is desired which should switch at specific different intervals, that is specific positions on the optoelectronic component 58 can be determined more exactly.

The invention claimed is:

1. An optoelectronic component having a longitudinal axis and being configured for the determination of the position of incidence of an incident light beam along the longitudinal axis, the optoelectronic component further having a photodiode structure with first and second opposed flat sides, third and fourth opposed longitudinal sides and fifth and sixth opposed end sides, having a first low ohmic contact layer at the first flat side for a first electric contact to the photodiode structure and having at least second and third low ohmic contact layers along the fifth and sixth end sides for second contacts to the photodiode structure, wherein at least one of the second and third contact layers not only extends along the respective end side, but also has part sections which extend partly along said third and fourth longitudinal sides, the part sections also having contact to the photodiode structure.

2. An optoelectronic component in accordance with claim 1, wherein the at least one of the second and third contact layers is symmetrical to the longitudinal axis and the part sections extend over the same distance along the opposed longitudinal sides.

3. An optoelectronic component in accordance with claim 2, wherein the part sections are connected to one another at an end remote at from the fifth and sixth end sides.

4. An optoelectronic component in accordance with claim 3, wherein the connection of the part sections passes through the light sensitive layer from the third longitudinal side to the fourth longitudinal side longitudinal.

5. An optoelectronic component in accordance with claim 1, wherein at least one low ohmic dividing layer extending parallel to the fifth and sixth end sides is provided from the third longitudinal side to the fourth longitudinal side longitudinal.

6. An optoelectronic component in accordance with claim 5, wherein the dividing layer passes through the light sensitive layer.

7. An optoelectronic component in accordance with claim 5, wherein the dividing layer not only extends from the third longitudinal side to the fourth longitudinal side, but also has part sections extending along the third and fourth longitudinal sides.

8. A light sensor having a light transmitter and an optical light reception system in a triangulation arrangement, the light sensor further having a light receiver which includes an optoelectronic component, the optoelectronic component having a longitudinal axis, having a photodiode structure with first and second opposed flat sides, third and fourth opposed longitudinal sides and fifth and sixth opposed end sides, having a first low ohmic contact layer at the first flat side for a first electric contact to the photodiode structure and having at least second and third low ohmic contact layers along the fifth and sixth end sides for second contacts to the photodiode structure, wherein at least one of the second and third contact layers not only extends along the respective end side, but also has part sections which extend partly along said third and fourth longitudinal sides, the part sections also having contact to the photodiode structure, the light sensor also having an evaluation unit for determining the distance of the object from the light sensor from a position of incidence of a light beam reflected by the object on the longitudinal axis of the optoelectronic component.

9. A light sensor in accordance with claim 8, wherein an output is provided to which an output signal is applied when an object is located within a specific distance range from the light sensor.

* * * * *